(12) United States Patent
Park et al.

(10) Patent No.: US 12,246,361 B2
(45) Date of Patent: Mar. 11, 2025

(54) POD CLEANING CHAMBER

(71) Applicant: STI Co., Ltd., Anseong-si (KR)

(72) Inventors: Young Soo Park, Anseong-si (KR); Dong Geun Hur, Anseong-si (KR); Ki Man Lee, Anseong-si (KR)

(73) Assignee: STI Co., Ltd., Anseong-si (KR)

( * ) Notice: Subject to any disclaimer, the term of this patent is extended or adjusted under 35 U.S.C. 154(b) by 462 days.

(21) Appl. No.: 17/527,211

(22) Filed: Nov. 16, 2021

(65) Prior Publication Data
US 2022/0152660 A1   May 19, 2022

(30) Foreign Application Priority Data

Nov. 16, 2020  (KR) .......................... 10-2020-0152756

(51) Int. Cl.
| | | |
|---|---|---|
| *B08B 3/02* | (2006.01) | |
| *B08B 13/00* | (2006.01) | |
| *F26B 3/04* | (2006.01) | |
| *F26B 3/30* | (2006.01) | |
| *G03F 7/00* | (2006.01) | |

(52) U.S. Cl.
CPC .............. *B08B 3/022* (2013.01); *B08B 13/00* (2013.01); *F26B 3/04* (2013.01); *F26B 3/30* (2013.01); *G03F 7/70925* (2013.01); *B08B 2230/01* (2013.01)

(58) Field of Classification Search
None
See application file for complete search history.

(56) References Cited

U.S. PATENT DOCUMENTS

| | | | |
|---|---|---|---|
| 2005/0000110 A1* | 1/2005 | Park ................. | H01L 21/67196 34/236 |
| 2007/0227562 A1* | 10/2007 | Lee .......................... | B08B 1/20 134/198 |
| 2012/0328403 A1* | 12/2012 | Rebstock .......... | H01L 21/67051 414/730 |
| 2018/0135198 A1* | 5/2018 | Ogata ............... | H01L 21/67126 |

FOREIGN PATENT DOCUMENTS

| | | |
|---|---|---|
| JP | 2925235 | 7/1999 |
| JP | 2004-281978 | 10/2004 |
| KR | 10-2008-0092049 | 10/2008 |
| TW | 201400202 | 1/2014 |

OTHER PUBLICATIONS

Grounds of Reason of Rejection Dated Dec. 28, 2022 From the Korean Intellectual Property Office Re. Application No. 10-2020-0152756. (7 Pages).
Notification of Office Action and Search Report Dated Apr. 8, 2022 From the Intellectual Property Office Ministry of Economic Affairs R.O.C. of Taiwan Re. Application No. 11120339080. (10 Pages).

\* cited by examiner

*Primary Examiner* — Cristi J Tate-Sims

(57) ABSTRACT

Proposed is a POD cleaning chamber including: a cleaning sub-chamber including an entrance door and accommodating and cleaning a separation POD being transported, the separation POD resulting from separating a POD; a drying chamber including an exit door and drying the separations POD transferred from the cleaning sub-chamber; a shutter being arranged between the cleaning sub-chamber and the drying chamber, the shutter being configured to ascend and descend; and a chamber moving mechanism transporting the separation POD from the cleaning sub-chamber to the drying chamber.

14 Claims, 10 Drawing Sheets

POD CLEANING CHAMBER

RELATED APPLICATION

This application claims the benefit of priority of Korean Patent Application No. 10-2020-0152756 filed on Nov. 16, 2020, the contents of which are incorporated herein by reference in their entirety.

FIELD AND BACKGROUND OF THE INVENTION

The present invention relates to a POD cleaning chamber. More specifically, the present invention relates to a POD cleaning chamber in cleaning and drying are performed in separate spaces when an inner POD and an outer POD are separately cleaned.

With industrial developments, semiconductors have been used in various fields, and technologies for increasing miniaturization have been under development.

In recent years, new semiconductor production technologies to which an extreme ultraviolet process (EUV) process is applied have gained an increase in popularity.

The EUV process in the semiconductor industry refers to an extreme ultraviolet lithography technology using an extreme ultraviolet wavelength light source or to a manufacturing process utilizing such a technology, in a photo process that is an important process in manufacturing semiconductors.

When manufacturing semiconductor chips, a silicon wafer substrate, that is, a circular disk is coated with a photosensitive material and is introduced into photo process equipment called a scanner. Within this equipment, a photolithography operation of emitting laser light is performed in order to transfer a circuit pattern onto the wafer substrate.

In this manner, many billions of circuit elements so minute as to be invisible without the use of a microscope are formed on a semiconductor chip. In the EUV process, this exposing step is performed by utilizing the extreme ultraviolet wavelength light source.

In the semiconductor chip manufacturing field, it is usually required to transfer an extremely minute circuit pattern onto the wafer substrate. When this is done, it is possible to integrate a lot more elements, such as transistors and capacitors into a chip on the size-restricted wafer substrate with a diameter of 300 mm and also to increase the performance of the element and the power efficiency thereof.

An EUV light source emits shorter wavelength light than an ArF light source used in an existing process, and because of this, a pattern can be transferred onto the wafer substrate in a more minute and compact manner. An EUV scanner that will soon be ready for the market utilizes EUV light having a wavelength of 13.5 nanometers that is only less than one tenth of a wavelength of light that is currently used by an ArF eximer laser scanner.

Moreover, in the related art, an exposing process needs to be repeated many times to form a minute circuit, but EUV equipment can reduce the number of process steps, thereby remarkably increasing the productivity.

However, unlike in an existing exposing technology, there are many problems with this EUV light, such as the need to reflect the EUV light in many phases and the restricted efficiency achieved only in a vacuum state.

In addition, related materials, such as an EUV mask, a pellicle for protecting the EUV mask, and photoresist that is a photosensitizer, are required to be developed in a novel manner. Particularly, it is difficult to manufacture a very-thin-film pellicle whose dimension is 110 mm×144 mm×50 nanometers in length, width, and thickness. It is more difficult to fixedly position the pellicle over the mask. A price per mask is hundreds of millions won, and a price per pellicle ranges from 20 million to 30 million won. For this reason, it is not easy to safely store and transport the mask and the pellicle.

Therefore, an EUV POD is necessary to store and transport the EUV mask and the pellicle.

The EUV POD includes an external POD and an internal POD. Only the inner POD is introduced into EUV exposing equipment, but in a fabrication process for mass production, steps need to be performed in this order: "scanning→inspecting→cleaning." Thus, chemical such as gas, is allowed to flow in from the outside and flows out thereto.

When the inner POD and the outer POD are cleaned, in a case where a foreign material is present therein, this can cause a serious problem in a semiconductor process. Thus, the importance of POD cleaning has greatly increased.

SUMMARY OF THE INVENTION

An objective of embodiments is to distinguish a cleaning sub-chamber and a drying chamber from each other when cleaning a POD and thus increase the efficiency of POD cleaning.

Problems that the present invention purports to solve are not restricted to the problem described above. From the following description, other problems that are not described above will be clearly understandable to a person of ordinary skill in the art.

According to an aspect of the present invention, there is provided a POD cleaning chamber including: a cleaning sub-chamber including an entrance door and accommodating and cleaning a separation POD being transported, the separation POD resulting from separating a POD; a drying chamber including an exit door and drying the separation POD transferred from the cleaning sub-chamber; a shutter being arranged between the cleaning sub-chamber and the drying chamber, the shutter being configured to ascend and descend; and a chamber moving mechanism transporting the separation POD from the cleaning sub-chamber to the drying chamber.

Desirably, in the POD cleaning chamber, the chamber moving mechanism may include a jig in which the separation POD arrives stably; and a moving unit being connected to the jig and moving the jig.

Desirably, in the POD cleaning chamber, the jig may include: a stably holding jig for supporting the separation POD; a coupling jig coupling the stably holding jig to the moving unit; and a plurality of support pins being coupled to the stably holding jig and providing support in such a manner that the separation POD arrives stably.

Desirably, in the POD cleaning chamber, the stably holding jig may be positioned at an inclined angle in such a manner that the separation POD arrives stably in an inclined manner.

Desirably, in the POD cleaning chamber, a portion of the moving unit may be positioned outside the cleaning sub-chamber and the drying chamber.

Desirably, in the POD cleaning chamber, the cleaning sub-chamber may include: a cleaning nozzle through which steam and a cleaning solution are injected toward the separation POD; and a first drying nozzle through which dry gas for drying the separation POD is injected.

Desirably, in the POD cleaning chamber, the cleaning sub-chamber may further include a first air knife being arranged adjacent to the shutter.

Desirably, in the POD cleaning chamber, the drying chamber may include a second drying nozzle through which drying gas for drying the separation POD is injected.

Desirably, in the POD cleaning chamber, the drying chamber may include an IR lamp.

Desirably, in the POD cleaning chamber, the drying chamber may further include a second air knife.

Desirably, in the POD cleaning chamber, the cleaning sub-chamber may include a controller controlling opening and closing of a first exhaust outlet and a second exhaust outlet, with the first exhaust outlet and the second exhaust outlet being arranged in the cleaning sub-chamber and the drying chamber, respectively.

Desirably, in the POD cleaning chamber, the controller may open the first exhaust outlet while primary drying of the separation POD is in progress in the cleaning sub-chamber or when the separation POD is transported to the drying chamber, and may discharge air within the cleaning sub-chamber to the outside.

Desirably, in the POD cleaning chamber, the controller may open the second exhaust outlet while drying is in progress in the drying chamber or when the separation POD is transported from the drying chamber to the outside after the exit door is open, and may discharge air within the drying chamber to the outside.

Desirably, in the POD cleaning chamber, the chamber moving mechanism may reciprocate in a backward-forward direction within the cleaning sub-chamber and the drying chamber.

According to the embodiments, the effect of increasing the efficiency of cleaning can be provided by separately performing cleaning and drying on the separation POD.

In addition, each process is performed on the inner POD and the outer POD in one direction without being repeatedly performed. Thus, the separation POD can be prevented from being contaminated.

In addition, the use of the exhaust outlet can prevent the separation POD from being contaminated in an area where the contamination of the separation POD possibly occurs.

In addition, the components of the POD are introduced into separate chambers, respectively. Thus, the efficiency of cleaning and drying can be increased.

Various advantageous effects of the present invention are not restricted to the effects described above and would be understood more easily from descriptions of specific embodiments of the present invention.

DESCRIPTION OF SPECIFIC EMBODIMENTS OF THE INVENTION

Figure 1:
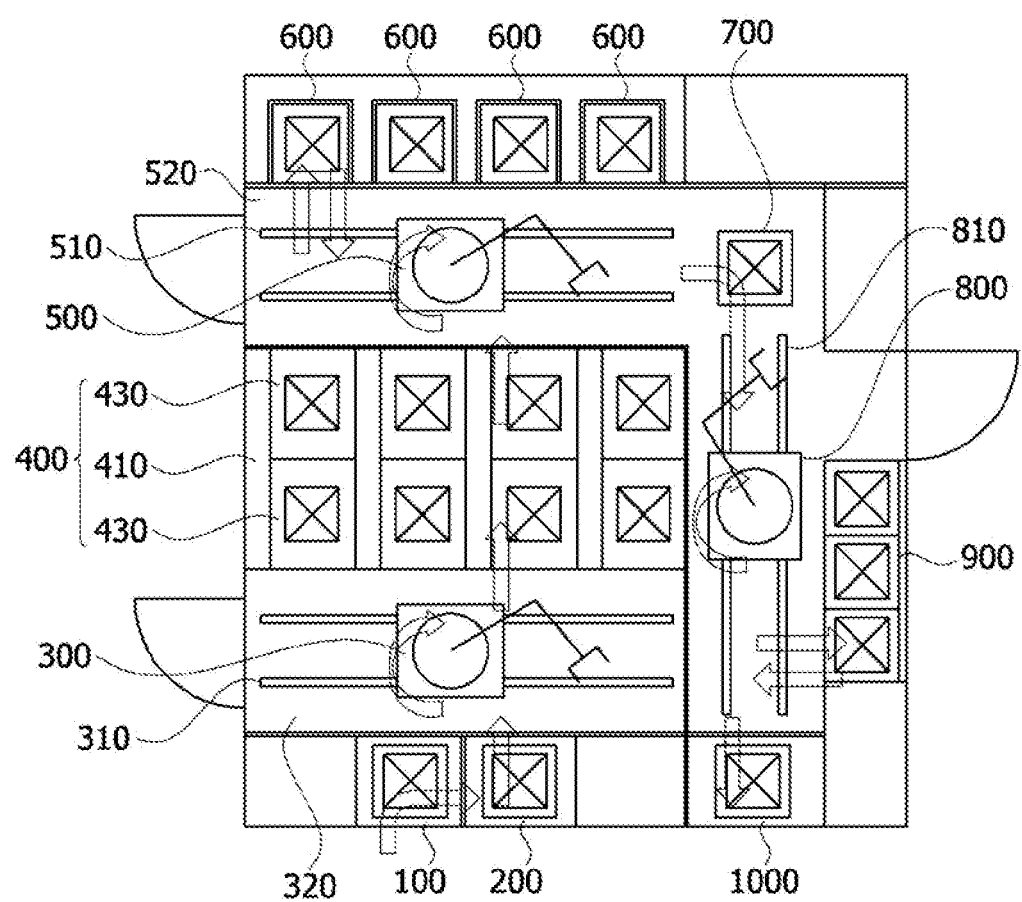
FIG. 1 is a view illustrating a structure of a POD cleaner according to a first embodiment of the present invention.

A preferred embodiment of the present invention will be described below with reference to the accompanying drawings.

However, the technical idea of the present invention is not restricted to embodiments described below and may be embodied in various different forms. One or more of constituent elements of an embodiment may be selectively combined with, or substituted for, one or more constituent elements of another embodiment if such a combination or a substitution falls within the scope of the technical idea of the present invention.

In addition, unless otherwise specifically defined in a clear manner, the meanings of the terms (including the technical and scientific terms) for embodiments of the present invention should be construed in a manner that is commonly understandable to a person of ordinary skill in the art to which the present invention pertains. The meanings of the terms that, like ones defined in a dictionary, are commonly used should be interpreted considering contextual meanings defined in the relevant technology.

In addition, the terms for the embodiments of the present invention are employed to describe the embodiments thereof and are not intended to impose any restriction on the present invention.

Throughout the present specification, unless otherwise specifically mentioned in a phrase or sentence, the singular may include the plural. In a case where the expression "at least one (or one or more) of A, B, and C" is used, the expression may be construed to include any one or more of A, B, and C.

In addition, the terms first, second, A, B, (a), (b), and so forth may be used in describing a constituent element of the embodiment of the present invention.

These terms are used only to distinguish one constituent element from another constituent element and do not impose any restriction on features of these constituent elements, the order thereof or a sequence thereof, and the like.

In a case where a constituent is described as being "coupled" to, "combined" with, or "connected" to, one other constituent element, this constituent element may be directly coupled to, combined with, or connected to, one other constituent element, or may be coupled to, combined with, or connected to, one other constituent element with an intervening constituent interposed therebetween.

In addition, in a case where a constituent element is described as being formed or arranged "on" one other constituent element, these two constituent elements come in direct contact with each other. Furthermore, in a case where a constituent element is described as being formed or arranged "over (above)" or "under (below)" one other constituent element, one or more intervening constituent elements may be formed or arranged between these two constituent elements. In addition, the expression "over (above)" or "under (below)" may be construed as indicating an upward direction or a downward direction on the drawings, depending on a reference direction from which one constituent element is drawn.

Embodiments will be described in detail below with reference to the accompanying drawings. Like constituent elements or corresponding constituent elements are given like reference numerals instead of different reference numerals, and the same description thereof is omitted.

FIGS. 1 to 14 clearly illustrate only an essential feature of the present invention to provide a conceptually clear understanding of the present invention. As a result, various modifications to the drawings are expected. The scope of the present invention does not need to be restricted by a specific shape illustrated in the drawings.

FIG. 1 is a view illustrating a structure of a POD cleaner according to a first embodiment of the present invention.

In the POD cleaner according to the first embodiment of the present invention, a POD to be cleaned includes an inner POD and an outer POD. A target to be transported arrives stably in the inner POD. The outer POD is arranged in such a manner as to surround the inner POD from outside the inner POD.

At this point, the inner POD may include a lower inner POD and an upper inner POD, and the outer POD may include a lower outer POD and an upper outer POD.

A POD used in the first embodiment of the present invention means an EUV POD used for storage and transportation of an EUV mask and a pellicle. In the embodiment of the present invention, a POD well known in the related art may be used.

With reference to FIG. 1, the POD cleaner according to an embodiment of the present invention may include a separation unit 200, a first transportation unit 300, a cleaning chamber 400, a vacuum chamber 600, a second transportation unit 500, and an assembly unit 700.

The POD is introduced into an introducing unit 100 through the outside of a housing of the POD cleaner. The POD moves to the separation unit 200 through the introducing unit 100.

The separation unit 200 may separate the POD into the inner POD and the outer POD and may separate the inner POD, resulting from the separation, into the lower inner POD and the upper inner POD and separate the outer POD into the lower outer POD and the upper outer POD.

The separation POD resulting from the separation by the separation unit 200 may move into the cleaning chamber 400 by the first transportation unit 300.

The first transportation unit 300 may transport the separation POD into the cleaning chamber 400.

As an implementation example, the first transportation unit 300 may move along a first transportation rail 310 arranged in a first space 320 and may transport the separation POD into the cleaning chamber 400.

The first transportation unit 300 may transport the lower inner POD, the upper inner POD, the lower outer POD, and the outer POD, which result from the separation, into a plurality of cleaning chambers 400, respectively. Thus, the efficiency of cleaning can be increased.

A dirty air zone into which outside air is possibly introduced may be formed in the first space 320 where the first transportation unit 300 is arranged.

A very high level of cleanliness is required of a space where the separation POD is cleaned. However, in a process of introducing the separation POD into the POD cleaner, the separation POD comes into contact with the outside air. Because the process of continuously introducing the separation POD is repeated, it is difficult to entirely block the outside air from being introduced.

Therefore, according to the present invention, in one part of the process of introducing the separation POD, an area into which the outside air is possibly introduced and in which the first transportation unit 300 is present is defined as the dirty air zone. A clean zone is defined in such a manner as to be formed in a process of cleaning the separation POD transported into the cleaning chamber 400.

The cleaning chamber 400 may clean and dry the separation POD introduced by the first transportation unit 300.

A plurality of cleaning chambers 400 are provided. The plurality of cleaning chambers 400 include a cleaning sub-chamber 430 and a drying chamber 410. The separation POD transported by the first transportation unit 300 is accommodated and cleaned in the cleaning sub-chamber 430. The separation POD transported from the cleaning sub-chamber 430 is dried in the drying chamber 410. The cleaning sub-chamber 430 and the drying chamber 410 may be spatially separated from each other.

The same numbers of cleaning sub-chambers 430 and drying chambers 410 may be arranged. The cleaning sub-chamber 430 and the drying chamber 410 may be arranged in a row in a moving direction of the separation POD.

As an implementation example, the cleaning sub-chamber 430 and the drying chamber 410 each may include four chambers, one for each of the lower inner POD, the upper inner POD, the lower outer POD, and the upper outer POD that are constituent parts resulting from separating the POD.

The cleaning sub-chamber 430 serves to clean the separation POD, and the drying chamber 410 serves to dry the cleaned separation POD.

At this time, various cleaning solutions and steam for cleaning are injected into the cleaning sub-chamber 430. At this time, in order to minimize the movement of the injected liquid into the drying chamber 410, primary drying may be performed before the separation POD moves into the drying chamber 410.

The separation POD introduced into the cleaning sub-chamber 430 stays inside the cleaning chamber 400 and thus is blocked from the outside thereof. However, in the process of introducing the separation POD, air in the dirty air zone formed in the first space 320 may move. Therefore, the dirty air zone may refer to the first space 320 and a space in the cleaning sub-chamber 430 of the cleaning chamber 400 and may entirely block air that comes into contact with the outside air when moving from the cleaning sub-chamber 430 to the drying chamber 410 through exhaust condition inside the cleaning chamber 400.

The cleaning chamber 400 may further include a chamber moving mechanism 450 that moves the cleaning sub-chamber 430 and the drying chamber 410.

The chamber moving mechanism 450 reciprocates in a forward-backward direction within the cleaning sub-chamber 430 and the drying chamber 410 that results from partitioning. Thus, the efficiency of cleaning and drying can be increased.

A plurality of chamber moving mechanisms 450 are provided. One chamber moving mechanism 450 is arranged for each row in which the cleaning sub-chamber 430 and the drying chamber 410 are arranged. The separation POD is cleaned in the cleaning sub-chamber 430. After cleaned, the separation POD moves to the drying chamber 410, and drying is performed on the separation POD.

The chamber moving mechanism 450 may be arranged outside the cleaning chamber 400, and a jig 451 for moving the separation POD may be arranged within the chamber.

A detailed configuration of the cleaning chamber 400 will be further described below.

The vacuum chamber 600 may vacuum-process the dried separation POD. A plurality of vacuum chambers 600 may be provided. Each of the plurality of vacuum chambers 600 may vacuum-process on the separation POD.

As an implementation example, two vacuum chambers 600 may be provided. The inner POD and the outer POD that are separation components are introduced into the two vacuum chambers 600, respectively. The inner POD and the outer POD are made of different materials. The inner POD and the outer POD that are made of the same material may be introduced into the same vacuum chamber 600, and thus the efficiency of vacuum processing can be increased using a vacuum state suitable for the material.

The number of vacuum chambers 600 is not restricted and may be variously adjusted considering a vacuum processing time and a cleaning and drying time in the cleaning chamber 400.

A detailed configuration and operation of the vacuum chamber 600 will be further described below.

The second transportation unit 500 may be arranged in a second space 520 in which the clean zone is formed and may transport the separation POD dried in the cleaning chamber 400 to the vacuum chamber 600 while moving along a second transportation rail 510.

As an implementation example, the second transportation unit 500 may transport into the vacuum chamber 600 the separation POD that passes through the cleaning sub-chamber 430 and the drying chamber 410 in each of four cleaning chambers 400 that are separated from each other.

In addition, the second transportation unit 500 may transport the separation POD vacuum-processed within the vacuum chamber 600 to the assembly unit 700.

The assembly unit 700 may assemble the separation PODs that undergo the cleaning processing and the vacuum processing. At this point, the assembly unit 700 may first assemble the lower inner POD and the upper inner POD into the inner POD and may assemble the lower outer POD and the upper outer POD into the outer POD. Subsequently, the assembly unit 700 may assemble the inner POD and the outer POD into the POD.

The POD resulting from the assembling in the assembly unit may be transported through a third assembly unit 700 and then may be discharged to the outside through a discharge unit.

The third assembly unit 700 may be arranged in a separate area, but may be arranged in a portion of the second space 520. The third assembly unit 700 may move along a third transportation line and may be discharged to the outside through the discharge unit.

In addition, a stocker 900 may be arranged in a portion of the second space 520. The POD resulting from the assembling in the assembly unit 700 may be stored in the stocker 900.

The stocker 900 is a space in which the POD that undergoes the cleaning processing and the vacuum processing is stored. Various well-known technologies for the stocker 900 may be employed.

Figure 2:
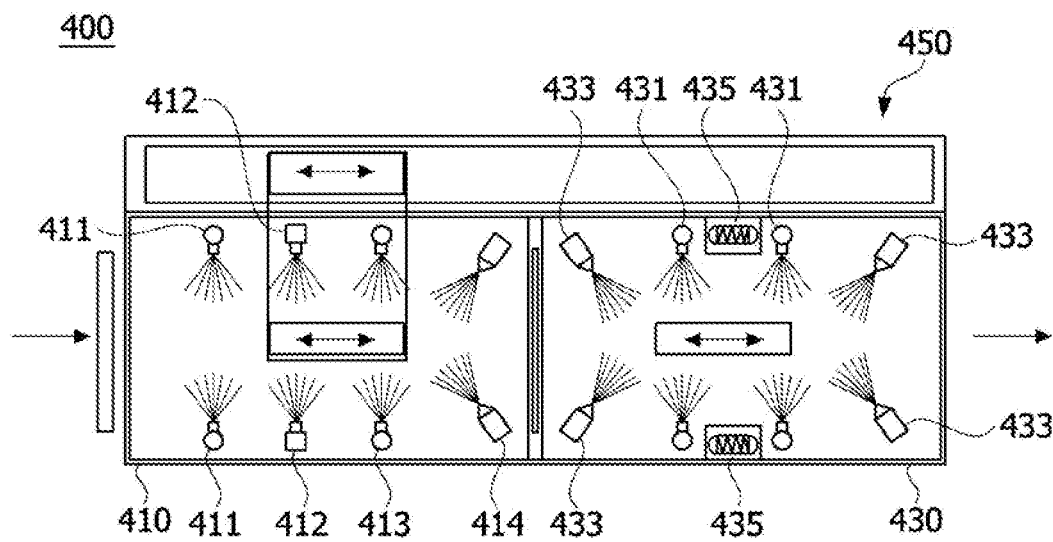
FIG. 2 is a view illustrating a structure of a cleaning chamber that is a constituent element in FIG. 1.
Figure 3:
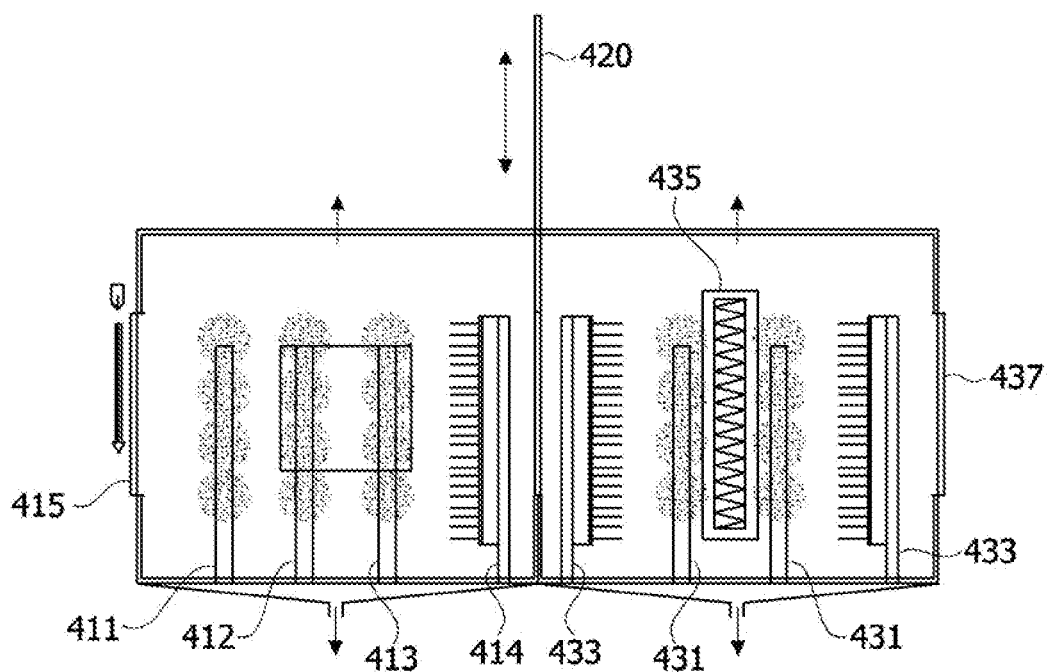
FIG. 3 is a view illustrating a structure of the cleaning chamber in FIG. 2.
Figure 4:
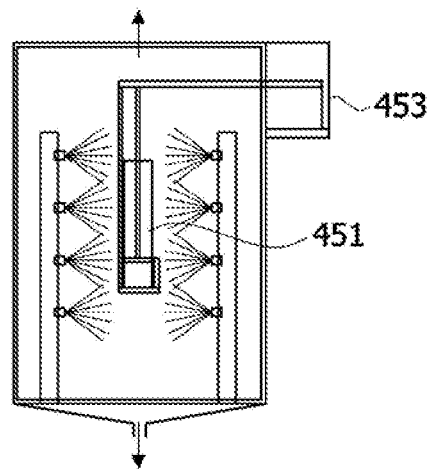
FIG. 4 is a view illustrating a detailed structure of the cleaning chamber in FIG. 2.

FIG. 2 is a view illustrating a structure of the cleaning chamber 400 that is a constituent element in FIG. 1. FIG. 3 is a view illustrating a structure of the cleaning chamber 400 in FIG. 2. FIG. 4 is a view illustrating a detailed structure of the cleaning chamber 400 in FIG. 2.

FIGS. 2 to 4 are views each illustrating one of the plurality of cleaning chambers 400 provided in the POD cleaner. The illustrated cleaning chamber 400 is described. The other cleaning chambers 400 have the same structure as the one illustrated in FIGS. 2 to 4, and thus the same description thereof is omitted.

With reference to FIGS. 2 to 4, the cleaning chamber 400 may include the cleaning sub-chamber 430, a drying chamber, a shutter 420, and the chamber moving mechanism 450.

The cleaning sub-chamber 430 may include an entrance door 415, and the separation POD transported by the first transportation unit 300 may be in accommodated and cleaned in the cleaning sub-chamber 430.

When the separation POD is going to be introduced, the entrance door 415 may be open. After the separation POD is introduced, the entrance door 415 may be closed, and thus the cleaning sub-chamber 430 may be separated from the first space 320.

The cleaning sub-chamber 430 may include a cleaning nozzle, a first drying nozzle 413, and an air knife.

Through the cleaning nozzle, the cleaning solution or the steam may be injected toward the separation POD. A plurality of cleaning nozzles may be provided within the cleaning sub-chamber 430. At this point, through each cleaning nozzle, DI (deionized water) and nitrogen ($N_2$) or clean dry air (CDA) may be sequentially injected.

Stream and DI that are injected through the cleaning nozzle dissolves even a small hole in the separation POD and a fine foreign material, and the fine foreign material becomes accordingly easier to remove. Thus, the efficiency of cleaning can be increased.

Thereafter, water remaining on a pipe and the nozzle may be pushed out using nitrogen or CDA, and thus the nozzle may be cleaned.

In addition, a plurality of cleaning nozzles that perform the same function as described above may be arranged, but a plurality of cleaning nozzles that perform different functions may be arranged.

As an implementation example, the cleaning nozzle may include a first cleaning nozzle 411 and a second cleaning nozzle 412.

The first cleaning nozzle 411 may inject deionized water (DI). At this point, hot DI may be injected through a first injection nozzle. A plurality of injection orifices may be arranged in the first cleaning nozzle 411 in the longitudinal direction of the chamber. Areas toward which DI is injected may overlap. Thus, DI may be injected toward the overlapping areas in such a manner that the entire separation POD is cleaned. At this point, control may be performed in such a manner that DI is injected in a range of heights greater than a height of the separation POD.

In addition, the first cleaning nozzles 411 constituting at least one pair may be arranged in a manner as to face each other in order to clean both sides of the separation POD.

The second cleaning nozzle 412 may inject steam. The second cleaning nozzle 412 may have the same arrangement structure as the first cleaning nozzle 411. A plurality of injection orifices may be arranged in the longitudinal direction of the cleaning sub-chamber 430. In addition, areas toward which steam is injected may overlap. Thus, the plurality of injection orifices may be arranged in such a manner that the entire separation POD is cleaned with steam injected therethrough.

first drying nozzles 413 may be arranged toward both sides, respectively, of the separation POD, and may inject high temperature gas. Nitrogen ($N_2$) or clean dry air (CDA) may be used as the gas to be injected through the first drying nozzle 413. The first drying nozzle 413 may serve to inject high temperature gas and thus dry a cleaning solution injected through the cleaning nozzle.

The first air knife 414 may be arranged adjacent to an exit of the cleaning sub-chamber 430 and the shutter 420 and thus may inject gas. As an implementation example, nitrogen (N$_2$) or clean dry air (CDA) may be used as the gas to be injected through the first air knife 414. The first air knives 414 may be arranged, in such a manner as to face each other, toward both sides, respectively, of the separation POD moving within the cleaning sub-chamber 430 and may inject gas at an angle inclined with respect to a surface of the separation POD. Accordingly, the first air knife 414 may serve to blow air against the cleaning solution remaining on entire surfaces of the separation POD for removal thereof before the separation POD is introduced into the drying chamber 410.

The drying chamber 410 may include an exit door 437 and may dry the separation POD transported from the cleaning sub-chamber 430.

The drying chamber 410 may include a second drying nozzle 431, an IR lamp 435, and a second air knife 433.

The second drying nozzle 431 may inject dry gas toward the separation POD transported from the cleaning sub-chamber 430. At least one pair of second drying nozzles 431 may be arranged. In order to increase the efficiency of drying, it is desirable that a plurality of pairs of second drying nozzles 431 are provided.

The second drying nozzles 431 may be arranged in such a manner as to face each other. A plurality of injection orifices may be arranged in the longitudinal direction of the cleaning sub-chamber 430. In addition, areas toward which the dry gas is injected may overlap. Thus, the plurality of injection orifices may be arranged in such a manner that the entire surfaces of the separation POD are cleaned with steam injected therethrough.

As an implementation example, nitrogen (N$_2$) or clean dry air (CDA) may be used as gas to be injected through the second drying nozzle 431.

The IR lamps 435 constituting a pair may be arranged in such a manner as to face each other and may emit infrared light, thereby drying the separation POD. As an implementation example, the IR lamp 435 may employ a technique in which a filament generates and thus emits infrared light. Alternatively, a selected area may be dried using an infrared LED. In addition, a ceramic heater may be used to emit infrared light or far infrared light for heating and thus for drying. There is no restriction on a structure or heat dissipation structure of the IR lamp 435. Various well-known structures may be employed.

The second air knife 433 may be arranged in the drying chamber 410 and may inject high temperature gas. As an implementation example, nitrogen (N$_2$) or clean dry air (CDA) may be used as the gas to be injected through the second air knife 433. The second air knives 433 may be arranged, in such a manner as to face each other, toward both sides, respectively, of the separation PD moving within the drying chamber 410 and may inject gas at an angle inclined with respect to a surface of the separation POD.

In addition, a plurality of pairs of second air knives 433 may be provided and may be arranged toward the entrance side and the exit side, respectively, of the drying chamber 410.

The exit door 437 may perform opening and closing operations in order to move the separation POD undergoing the drying to the second space 520.

The shutter 420 may be arranged between the cleaning sub-chamber 430 and the drying chamber 410 and may ascend and descend therebetween.

The shutter 420 may serve to perform partitioning into the cleaning sub-chamber 430 and the drying chamber 410 and may block the air within the cleaning sub-chamber 430 from being introduced during drying in the drying chamber 410. A drive unit may be coupled to the shutter 420, and the shutter 420 may have a structure for ascending and descending.

The chamber moving mechanism 450 may receive the separation POD transported from the first transportation unit 300 and may transport the received separation POD from the cleaning sub-chamber 430 to the drying chamber 410. At this point, the chamber moving mechanism 450 may reciprocate in the backward-forward direction within the cleaning sub-chamber 430 or the drying chamber 410. Thus, the efficiency of cleaning or drying can be increased.

A detailed configuration of the chamber moving mechanism 450 will be further described below.

Figure 5:
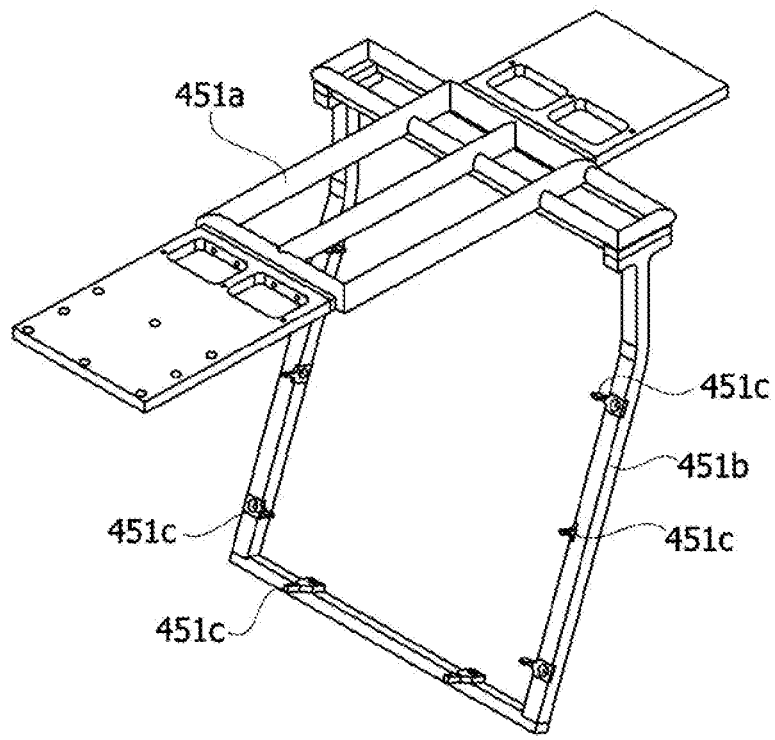
FIG. 5 is a view illustrating a structure of a jig that is a constituent element in FIG. 2.
Figure 6:
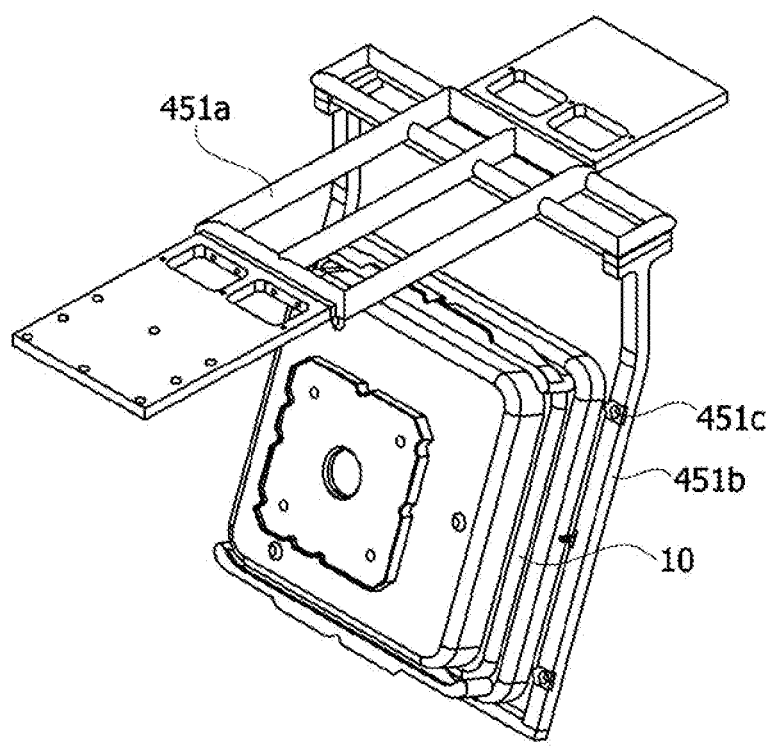
FIG. 6 is a view illustrating a state where a separation POD stably arrives in a jig in FIG. 5.
Figure 7:
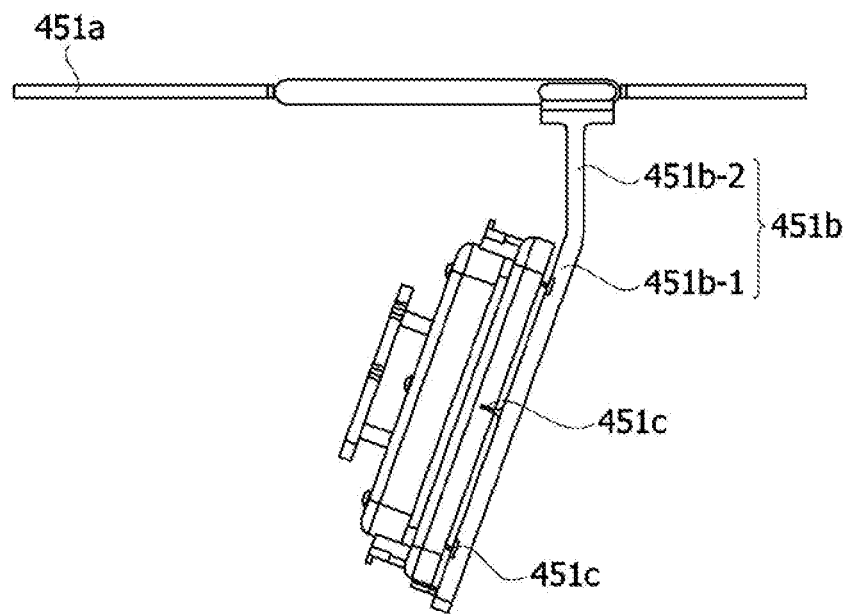
FIG. 7 is a view illustrating the state in FIG. 6, when viewed from the side.

FIG. 5 is a view illustrating a structure of the jig 451 that is a constituent element in FIG. 2. FIG. 6 is a view illustrating a state where the separation POD stably arrives in the jig 451 in FIG. 5. FIG. 7 is a view illustrating the state in FIG. 6, when viewed from the side.

With reference to FIGS. 5 to 7, the chamber moving mechanism 450, which is a constituent element of the cleaning chamber 400, may include the jig 451 and a moving unit 453.

A separation POD 10 stably arrives in the jig 451. The jig 451 may include a coupling jig 451a and a stably holding jig 451b.

A portion of the coupling jig 451a may be coupled to a coupling unit. The coupling jig 451a may be arranged in such a manner that the portion thereof protrudes into the cleaning chamber 400. As an implementation example, the coupling jig 451a may be arranged in such a manner as to have a structure that enables a plurality of frames to be coupled thereto.

The stably holding jig 451b may include a frame and a plurality of support pins 451c.

The stably holding jig 451b may be coupled to a portion of the coupling jig 451a and may have a structure in which the separation POD stably arrives therein. The stably holding jig 451b may be configured in the shape of a frame having empty spaces both on the flank lateral sides in such a manner that cleaning and drying of the separation POD is possible when the separation POD stably arrives therein. As an implementation example, the stably holding jig 451b may be formed in such a manner as to have a rectangular cross-section having a greater size than an external edge of the separation POD. Thus, the stably holding jig 451b may be exposed to both the lateral sides of the separation POD 10 so that the separation POD 10 stably arrives in the stably holding jig 45.

In addition, the stably holding jig 451b may be arranged in an inclined manner. Thus, the separation POD 10 stably arriving in the stably holding jig 451b may be prevented from deviating therefrom while moving.

As an implementation example, a structure of the stably holding jig 451b may be obtained by combining an inclination portion 451b-1 and the straight-line portion 451b-2 with each other. The straight-line portion 451b-2 may be coupled to a portion of the coupling jig 451a. The inclination portion 451b-1 may be formed in such a manner as to extend from an end portion of the straight-line portion 451b-2.

The straight-line portion 451b-2 to be coupled to the inclination portion 451b-1 may have a predetermined length. Thus, a space may be formed in the inclination portion 451b-1 of the stably holding jig 451b in such a manner that the separation POD stably arrives in the space. Accordingly, the separation POD, when going to stably arrive in the stably holding jig 451b, can be prevented from colliding with the frame.

A plurality of support pins 451c may be provided to be coupled to the stably holding jig 451b. The support pins 451c may be arranged on a lower portion of the frame to support a lower portion of the separation POD and may be arranged on flank surfaces of the frame to support both flank surfaces of the separation POD and a rear surface thereof.

The inclination of the frame can prevent a front portion of the separation POD 10 from deviating from the stable holding jig 451b, and a rear portion of the separation POD 10 may be supported on the support pins 451c.

The moving unit 453 may be coupled to the jig 451 and thus may move the jig 451 within the cleaning chamber 400.

According to a user setting, the moving unit 453 may be set to reciprocate within the cleaning sub-chamber 430 or the drying chamber 410. The separation POD that undergoes cleaning may be moved from the cleaning sub-chamber 430 to the drying chamber 410.

A portion for driving, of the moving unit 453 may be arranged outside the cleaning chamber 400. The moving unit 453 may be configured to include a rail, a motor, or the like for moving the jig 451.

As an implementation example, the moving unit 453 may be arranged outside the cleaning chamber 400. A portion, coupled to the moving unit 453, of the coupling jig 451a may be present within the cleaning chamber 400. Thus, introduction of a foreign material occurring in the moving unit 453 into the cleaning chamber 400 can be minimized.

In addition, an air flowing-out blocking structure may be installed in an area where the moving unit 453 is arranged. Thus, air within the cleaning chamber 400 can be blocked from flowing out.

As an implementation example, nitrogen or CDA is introduced from the area, where the moving unit 453 is arranged, into the cleaning chamber 400. This fluid flow occurs continuously. Air is discharged through the exhaust outlet inside the cleaning chamber 400. Thus, air present in the direction of the arrangement of the moving unit 453 is arranged can be prevented from being introducing into the cleaning chamber 400.

Figure 8:
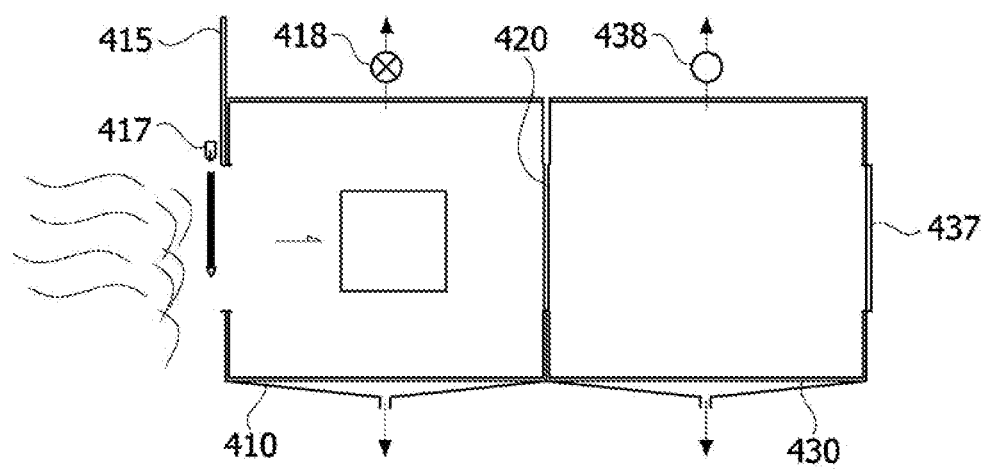
FIGS. 8, 9 and 10 are views each illustrating an internal exhaust structure of the cleaning chamber in FIG. 3 within which the separation POD moves.
Figure 9:
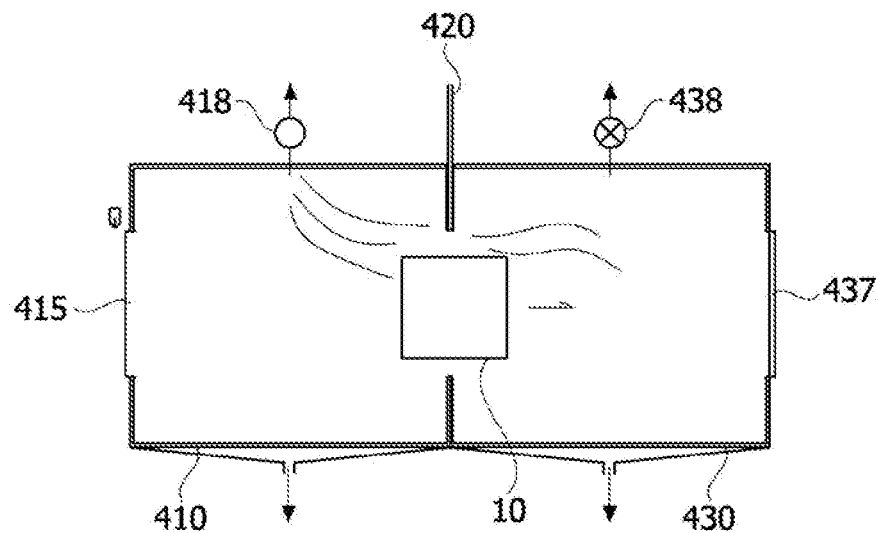
Figure 10:
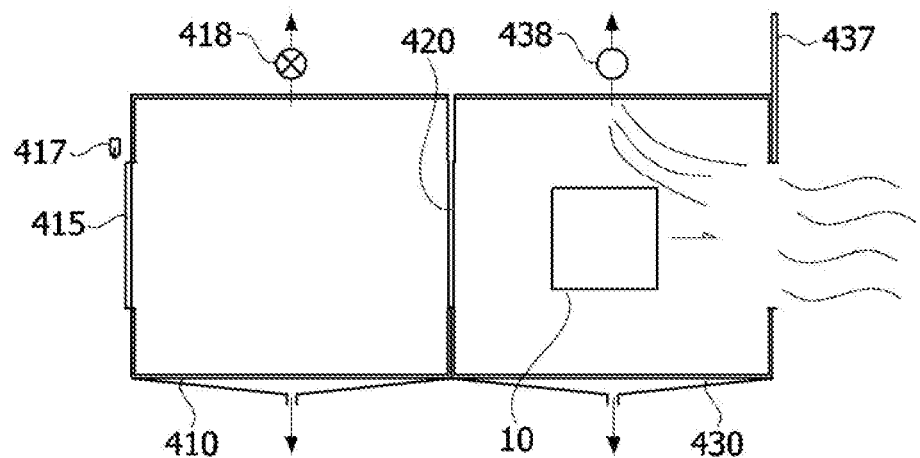

FIGS. 8 to 10 are views each illustrating an internal exhaust structure of the cleaning chamber 400 in FIG. 3 within which the separation POD moves.

With reference to FIGS. 8 to 10, an exhaust outlet may be provided within the cleaning chamber 400, that is, in each of the cleaning sub-chamber 430 and the drying chamber 410. Opening and closing of each of the exhaust outlet may be controlled by a controller.

A first exhaust outlet 418 and a second exhaust outlet 438 may be arranged in the cleaning sub-chamber 430 and the drying chamber 410, respectively. The controller may control the first exhaust outlet 418 and the second exhaust outlet 438 according to a situation where the separation POD moves within the cleaning chamber 400 and thus may block a foreign material from being introduced.

FIG. 8 illustrates a state where the separation POD is introduced into the cleaning chamber 400. In a case where the separation POD is introduced into the cleaning chamber 400, the entrance door 415 is closed, and the separation POD stably arrives in the chamber moving mechanism 450 within the cleaning chamber 400.

An air curtain 417 is arranged toward the entrance door 415 in order to minimize the introduction of the foreign material due to the opening and closing of the entrance door 415. When the separation POD is introduced, the air curtain 417 operates to minimize the introduction of the foreign material. In a case where the separation POD is introduced into the cleaning chamber 400, the shutter 420 is kept in a closed state, and the first exhaust outlet 418 is not open.

FIG. 9 illustrates a state where the separation POD undergoing cleaning in the cleaning chamber 400 moves to the drying chamber 410.

The separation POD undergoing cleaning in the cleaning chamber 400 moves into the drying chamber 410. At this point, the entrance door 415 is kept closed in order to block air within the first space 320 from moving. The shutter 420 is open in order to allow the separation POD stably arriving in the chamber moving mechanism 450 to move.

In a case where cleaning is performed on the separation POD in the cleaning sub-chamber 430, the first exhaust outlet may be open, and thus, the air within the cleaning sub-chamber 430 may be continuously discharged to the outside therethrough. This is done to prevent liquid (stream or DIW) used for cleaning from flowing out to the outside due to an increase in pressure within the chamber during cleaning.

When the separation POD undergoing cleaning moves from the cleaning sub-chamber 430 to the drying chamber 410, the first exhaust outlet 418 arranged within the cleaning sub-chamber 430 is open, and thus, the air within the cleaning sub-chamber 430 is discharged to the outside. At this point, there is present cleaner air in the drying chamber 410 than in the cleaning sub-chamber 430, and the cleaner air within the drying chamber 410 may be introduced.

Accordingly, humidity or a foreign material present that is in the cleaning sub-chamber 430 may be blocked from being introduced into the drying chamber 410.

FIG. 10 illustrates a state where the separation POD undergoing drying in the drying chamber 410 is transported to the second space 520.

In a case where drying is performed in the drying chamber 410, the shutter 420 is kept closed to maintain partitioning into the cleaning sub-chamber 430 and the drying chamber 410.

At this point, the second exhaust outlet 438 arranged within the drying chamber 410 may be open while a drying operation is performed, and thus, the air within the drying chamber 410 may be continuously discharged to the outside.

When the drying is finished, an entrance door is open. The second exhaust outlet 438 is open by the controller in order to prevent the air present within the drying chamber 410 to flow out into the second space 520, and the air within the drying chamber 410 is discharged to the outside. At this point, the second exhaust outlet 438 absorbs the air within the drying chamber 410 and discharges the absorbed air to the outside. Accordingly, clean air present within the second space 520 is introduced. Thus, outside air present in the drying chamber 410 can be prevented from flowing out.

Figure 11:
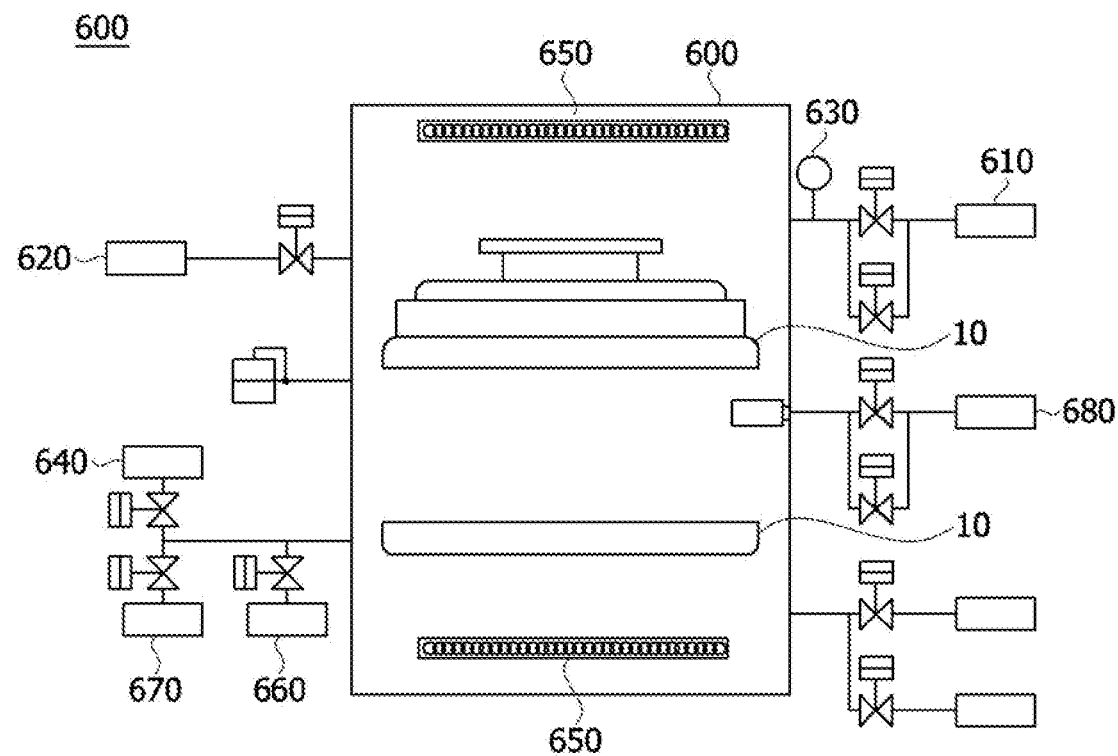
FIG. 11 is a view illustrating an internal structure of a vacuum chamber that is a constituent element in FIG. 1.

FIG. 11 is a view illustrating an internal structure of the vacuum chamber 600 that is a constituent element in FIG. 1.

With reference to FIG. 11, a plurality of vacuum chambers 600 may be provided. The separation PODs (the inner PODs or the outer PODs) made of the same material may be arranged within each of the chambers.

A low vacuum pump 610 and a high vacuum pump 620 may be provided within the vacuum chamber 600 and may individually operate according to an internal condition of the vacuum chamber 600.

A pressure sensor 630 for sensing pressure and a Pirani gauge 640 for measuring pressure and may be arranged within the vacuum chamber 600. A plurality of heaters for preventing a decrease in temperature due to a drop in pressure may be arranged within the vacuum chamber 600. In this case, an IR heater 650 may be used as the heater.

In addition, a residual gas analyzer (RGA) sensor 660 for measuring a cleanness level of the separation POD may be provided within the vacuum chamber 600 and may analyze the number of molecules removed from surfaces of the separation POD or surfaces of the vacuum chamber 600 on a per-mass basis and may measure the cleanness level.

A nitrogen pump 680 for injecting nitrogen according to an internal state of the chamber may be provided in the vacuum chamber 600 and may diffuse nitrogen through a diffuser.

A detailed configuration of the vacuum chamber 600 is not restricted to the above-provided description thereof. Various well-known cleaning technologies for the chamber 600 may be employed.

A POD cleaning process according to a second embodiment of the present invention will be described below with reference to the accompanying drawings. However, descriptions that are the same as descriptions of the POD cleaner and the POD cleaning chamber 400 according to the first embodiment of the present invention are omitted.

Figure 12:
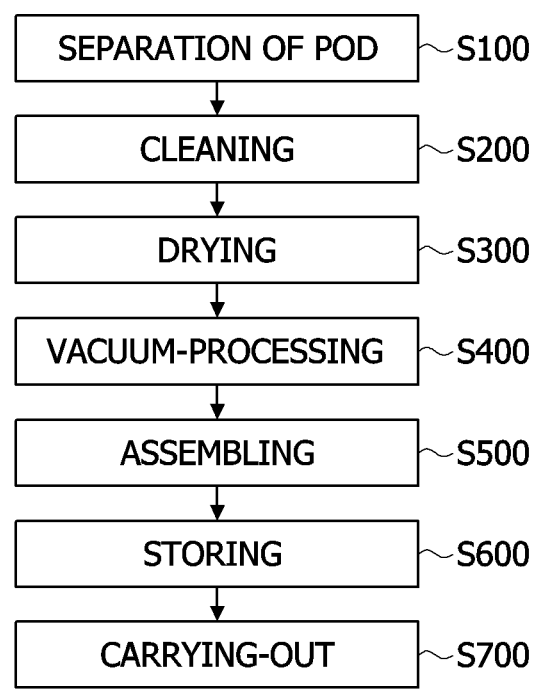
FIG. 12 is a flowchart illustrating a flow for a POD cleaning process using the POD cleaner in FIG. 1.
Figure 13:
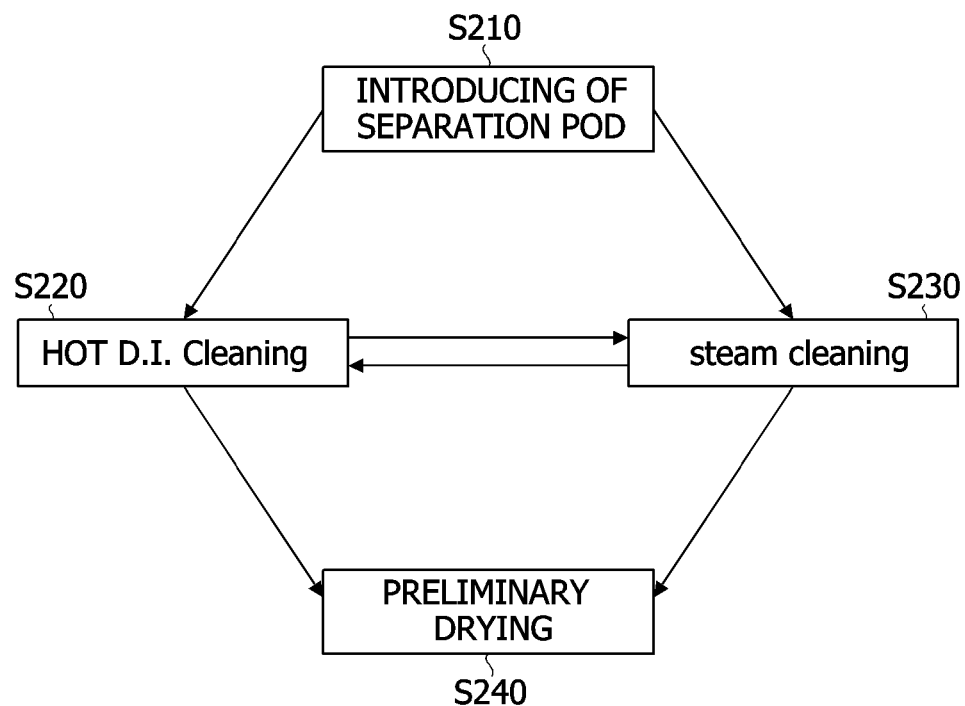
FIG. 13 is a view illustrating a detailed sub-step of a cleaning step that is a constituent element in FIG. 12.
Figure 14:
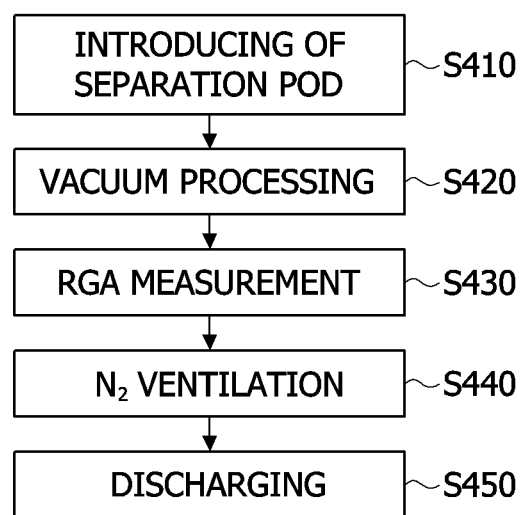
FIG. 14 is a view illustrating a detailed sub-step of a vacuum processing step that is a constituent element in FIG. 12.

FIG. 12 is a flowchart illustrating a flow for the POD cleaning process using the POD cleaner in FIG. 1. FIG. 13 is a view illustrating a detailed sub-step of a cleaning step that is a constituent element in FIG. 12. FIG. 14 is a view illustrating a detailed sub-step of a vacuum processing step that is a constituent element in FIG. 12.

The same reference numeral in FIGS. 12 to 14 as in FIGS. 1 to 11 depicts the same constituent element as in FIGS. 1 to 11, and a detailed description of the same constituent element is omitted.

With reference to FIGS. 12 to 14, the POD cleaning process according to the second embodiment of the present invention may include a separation step S100, a cleaning step S200, a drying step S300, a vacuum processing step S400, an assembly step S500, a storage step S600, and a carrying-out step S700.

In the separation step S100, in the separation unit 200, the POD introduced through the introducing unit 100 may be separated into the component parts of the inner POD and the component part of the outer POD. As an implementation example, in the separation step S100, the inner POD may be separated into the upper inner POD and the lower inner POD, and the outer POD is separated into the upper outer POD and the lower outer POD.

In the separation step S100, the separation PODs that result from the separation are introduced into the plurality of cleaning chambers 400, respectively, each of which is separated into four chambers. In the cleaning step S200, the separation POD introduced into the cleaning chamber 400 may be cleaned in the cleaning sub-chamber 430. In the drying step S300, the separation POD introduced into the cleaning chamber 400 is dried in the drying chamber 410.

In the cleaning step S200, the transported separation POD is cleaned in the cleaning sub-chamber 430.

The cleaning step S200 may include a POD introducing step S210, cleaning steps S220 and S230, and a preliminary drying step S240.

In the POD introducing step S210, the separation POD transported by the first transportation unit 300 is introduced into the cleaning sub-chamber 430. At this point, the separation POD transported by the first transportation unit 300 may stably arrive in the chamber moving mechanism 450 and may move within the cleaning chamber 400.

At this point, in a case where the separation POD is introduced by the first transportation unit 300 into the cleaning sub-chamber 430, the air curtain 417 arranged in an entrance to the cleaning sub-chamber 430 operates, and thus the introduction of the air or the foreign material in the first space 320 into the cleaning sub-chamber 430 can be minimized.

In the cleaning steps S220 and S230, the cleaning solution is injected toward the separation POD, and thus the separation POD is cleaned. At this point, the cleaning step S200 may include the cleaning step S220 of performing cleaning using hot DI water and the cleaning step S230 of performing cleaning using steam.

In the cleaning steps S220 and S230, the chamber moving mechanism 450 may be driven in such a manner as to reciprocate in the backward-forward direction within the cleaning sub-chamber 430.

At this point, in the cleaning step S200, the first exhaust outlet may be kept open, and thus the air within the cleaning sub-chamber 430 may be discharged to the outside.

Subsequently, in the cleaning step S200, the preliminary drying step S240 may be performed before the separation POD proceeds to the drying step S300. In the preliminary step S240, before the cleaned separation POD proceeds to the drying step S300, water on surfaces thereof may be removed. Thus, the introduction of the foreign material into the drying chamber 410 can be minimized.

The shutter 420 performs partitioning into the cleaning sub-chamber 430 and the drying chamber 410. In the cleaning step S200, the shutter 420 is open when the separation POD proceeds to the drying step S300. At this point, the first exhaust outlet 418 arranged within the cleaning sub-chamber 430 may be kept open. Thus, the air within the cleaning sub-chamber 430 can be prevented from being introduced into the drying chamber 410.

In the drying step S300, the separation POD undergoing the cleaning step S200 is dried within the drying chamber 410.

In the drying step S300, gas drying and IR drying may be performed. The separation POD entering the drying step S300 may be dried with high temperature nitrogen ($N_2$) or clean dry air (CDA).

In addition, the IR drying may be performed using the IR lamp 435. The IR lamps 435 constituting a pair may be arranged in such a manner as to face each other and may emit infrared light, thereby drying the separation POD.

In the drying step S300, the second exhaust outlet 438 may be open, and thus the air within the drying chamber 410 may be discharged to the outside.

The separation POD dried in the drying step S300 is transported by the second transportation unit 500. At this point, in a case where the separation POD is discharged in the drying step S300, the second exhaust outlet 438 arranged within the drying chamber 410 may be kept open. Thus, the air within the drying chamber 410 may be absorbed, and the absorbed air may be discharged to the outside. Accordingly, the air within the drying chamber 410 can be prevented from being introduced into the second space 520.

In the vacuum processing step S400, the separation POD undergoing the drying step S300 is vacuum-processed.

The vacuum processing step S400 may include a POD introducing step S410, a vacuum processing step S420, a residual gas analyzer (RGA) measurement step S430, a nitrogen ventilation step S440, and a discharge step S450.

In the POD introducing step S410, the separation POD undergoing the drying step S300 is introduced into the vacuum chamber 600. The separation PODs transported by the chamber moving mechanism 450 are held in the second transportation unit 500, and the second transportation unit 500 introduces the separation PODs into a plurality of vacuum chambers 600. At this point, among the separation PODs that are cleaned as component parts, the component parts of the inner POD made of the same material are introduced into one vacuum chamber 600, and the component parts of the outer POD are introduced into one other vacuum chamber 600.

At this point, an introducing inlet of the vacuum chamber 600 may be open and closed by an air cylinder.

In the vacuum processing step S420, a low vacuum pump 610 operates after the separation POD is introduced into the vacuum chamber 600. At this point, pressure is sensed by the pressure sensor 630. When a negative pressure is reached, the pressure is measured by the Pirani gauge 640.

When pressure within the vacuum chamber 600 enters a middle vacuum range suitable for driving, a high vacuum valve is open, and the high vacuum pump 620 is driven.

Thereafter, when the pressure within the vacuum chamber 600 enters a suitable high vacuum range, the pressure is measured by an ion gauge 670. When a vacuum state suitable for sensing is reached, the RGA sensor 660 is operated.

The RGA sensor 660 analyzes the number of molecules removed from the surfaces of the separation POD or the surfaces of the vacuum chamber 600 on a per-mass basis and measures the cleanness level. In a case where the cleanness level satisfies a predetermined requirement, the vacuum pump stops operating.

Thereafter, in the nitrogen ventilation step S440, the nitrogen pump 680 injects nitrogen into the vacuum chamber 600. Accordingly, the pressure within the chamber becomes the same as the atmospheric pressure. Then, the separation POD is discharged from within the vacuum chamber 600.

In the assembly step S500, the inner POD and the outer POD that undergo the vacuum processing step S400 are transported by the second transportation unit 500 to the assembly unit 700, and the inner POD and the outer POD are assembled in the assembly unit 700.

In the storage step S600, the POD into which the separation PODs are assembled in the assembly step S500 is stored in the stocker 900.

According to the present invention, the stocker 900 may be arranged within the POD cleaner. The POD may be stored in the stocker 900 whenever necessary. A well-known detailed configuration may be employed as a detailed configuration of the stocker 900.

In the carrying-out step S700, the stored POD may be transported, or the POD into which the separation PODs are assembled in the assembly step S500 may be carried out by a carrying-out unit 1000. In the carrying-out step S700, a third transportation unit 800 may operate to transport the POD stored in the stocker 900, thereby carrying out that POD to the outside or may transport the POD into which the separation PODs are assembled in the assembly unit 700, thereby carrying out that POD to the outside.

The embodiments of the present invention are described in detail above with reference to the accompanying drawings.

The technical idea of the present invention is described above only for illustrative purpose. It would be apparent to a person of ordinary skill in the art to which the present invention pertains that various modifications, alterations, substitutions are possible within the scope that does not depart from the essential features of the present invention. Therefore, the disclosed embodiments of the present inventions and the accompanying drawings are provided to describe rather than restrict the technical idea of the present invention. The scope of the technical idea of the present invention is not restricted by the disclosed embodiment and the accompanying drawings. Accordingly, the scope of protection of the present invention should be defined by the following claims. All technical ideas that fall within the scope equivalent thereto should be interpreted to be included within the claims of the present invention.

REFERENCES

10: POD 100; Introducing unit 200: Separation unit
300: First transportation unit
310: First transportation rail 320: First space
400: Cleaning chamber 410: Drying chamber
411: First cleaning nozzle 412: Second cleaning nozzle
413: First drying nozzle 414: First air knife
415: Entrance door 417: Air curtain
418: First exhaust outlet 420: Shutter
430: Cleaning sub-chamber 431: Second drying nozzle
433: Second air knife 435: IR lamp
437: Exit door 438: Second exhaust outlet
450: Chamber moving mechanism 451: Jig 451a: Coupling jig
451b: Stably holding jig 451b-1: Inclination portion
451b-2: Straight-line portion 451c: Support pin
453: Moving unit 500: Second transportation unit
510: Second transportation rail 520: Second space
600: Vacuum chamber 610: Low vacuum pump
620: High vacuum pump 630: Pressure sensor
640: Pirani gauge 650: IR heater 660: RGA sensor
670: Ion gauge 680: Nitrogen pump 700: Assembly unit
800: Third transportation unit 900: Stocker
1000: Carrying-out unit

What is claimed is:

1. A POD cleaning chamber comprising:
    a cleaning sub-chamber including an entrance door and accommodating and cleaning a separation POD being transported, the separation POD resulting from separating a POD;
    a drying chamber including an exit door and drying the separation POD transferred from the cleaning sub-chamber;
    a shutter being arranged between the cleaning sub-chamber and the drying chamber, the shutter being configured to ascend and descend; and
    a chamber moving mechanism transporting the separation POD from the cleaning sub-chamber to the drying chamber, comprising:
    a jig on which the separation POD is stably mounted, and a moving unit coupled to the jig to move the jig,
    wherein the moving unit is arranged outside the cleaning sub-chamber and the drying chamber,
    wherein the jig comprises a holding jig for supporting the separation POD and a coupling jig for connecting the holding jig to the moving unit,
    wherein the holding jig comprises:
    a first portion coupled to the coupling jig to downward at a right angle, a second portion extending from an end of the first portion at an inclination and arrived to the separation POD, and support pins provided to be coupled to the second portion and arranged on a lower portion of the second portion to support a lower portion of the separation POD, and arranged on side surfaces of a frame to support both side surfaces of the separation POD and a rear surface thereof, wherein the second portion formed to have a rectangular cross-section having a greater size than an external edge of the separation POD so that the holding jig exposed to both the lateral sides of the separation POD.

2. The POD cleaning chamber of claim 1, wherein the chamber moving mechanism comprises:

a jig in which the separation POD arrives stably; and a moving unit being connected to the jig and moving the jig.

3. The POD cleaning chamber of claim 2, wherein the jig comprises:

a stably holding jig for supporting the separation POD;

a coupling jig coupling the stably holding jig to the moving unit; and a plurality of support pins being coupled to the stably holding jig and providing support in such a manner that the separation POD arrives stably.

4. The POD cleaning chamber of claim 3, wherein the stably holding jig is positioned at an inclined angle in such a manner that the separation POD arrives stably in an inclined manner.

5. The POD cleaning chamber of claim 1, wherein a portion of the moving unit is positioned outside the cleaning sub-chamber and the drying chamber.

6. The POD cleaning chamber of claim 1, wherein the cleaning sub-chamber comprises:

a cleaning nozzle through which steam and a cleaning solution are injected toward the separation POD; and a first drying nozzle through which dry gas for drying the separation POD is injected.

7. The POD cleaning chamber of claim 6, wherein the cleaning sub-chamber further comprises:

a first air knife being arranged adjacent to the shutter.

8. The POD cleaning chamber of claim 1, wherein the drying chamber comprises:

a second drying nozzle through which drying gas for drying the separation POD is injected.

9. The POD cleaning chamber of claim 1, wherein the drying chamber comprises:

an IR lamp.

10. The POD cleaning chamber of claim 1, wherein the drying chamber further comprises:

a second air knife.

11. The POD cleaning chamber of claim 1, wherein the cleaning sub-chamber comprises:

a controller opening controlling opening and closing of a first exhaust outlet and a second exhaust outlet, with the first exhaust and the second exhaust outlet being arranged in the cleaning sub-chamber and the drying chamber, respectively.

12. The POD cleaning chamber of claim 11, wherein the controller opens the first exhaust outlet while primary drying of the separation POD is in progress in the cleaning sub-chamber or when the separation POD is transported to the drying chamber, and discharges air within the cleaning sub-chamber to the outside.

13. The POD cleaning chamber of claim 11, wherein the controller opens the second exhaust outlet while drying is in progress in the drying chamber or when the separation POD is transported from the drying chamber to the outside after the exit door is open, and discharges air within the drying chamber to the outside.

14. The POD cleaning chamber of claim 1, wherein the chamber moving mechanism reciprocates in a backward-forward direction within the cleaning sub-chamber and the drying chamber.

* * * * *